United States Patent
Zang

(10) Patent No.: US 9,431,303 B2
(45) Date of Patent: Aug. 30, 2016

(54) CONTACT LINERS FOR INTEGRATED CIRCUITS AND FABRICATION METHODS THEREOF

(71) Applicant: GLOBALFOUNDRIES Inc., Grand Cayman (KY)

(72) Inventor: Hui Zang, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/516,674

(22) Filed: Oct. 17, 2014

(65) Prior Publication Data

US 2016/0111339 A1 Apr. 21, 2016

(51) Int. Cl.
*H01L 21/00* (2006.01)
*H01L 21/8238* (2006.01)
*H01L 29/45* (2006.01)
*H01L 27/092* (2006.01)
*H01L 29/08* (2006.01)
*H01L 21/285* (2006.01)
*H01L 21/321* (2006.01)

(52) U.S. Cl.
CPC . *H01L 21/823814* (2013.01); *H01L 21/28518* (2013.01); *H01L 21/28568* (2013.01); *H01L 21/321* (2013.01); *H01L 21/823807* (2013.01); *H01L 21/823821* (2013.01); *H01L 21/823871* (2013.01); *H01L 27/092* (2013.01); *H01L 29/0847* (2013.01); *H01L 29/45* (2013.01)

(58) Field of Classification Search
CPC .......... H01L 21/28518; H01L 21/28568; H01L 21/321; H01L 21/823871; H01L 21/823814; H01L 29/41791; H01L 29/785; H01L 29/7839

See application file for complete search history.

(56) References Cited

U.S. PATENT DOCUMENTS

| | | | |
|---|---|---|---|
| 2012/0276695 A1* | 11/2012 | Cheng | H01L 27/1211 438/154 |
| 2014/0217517 A1* | 8/2014 | Cai | H01L 27/0886 257/401 |
| 2014/0306290 A1* | 10/2014 | Alptekin | H01L 29/41725 257/369 |
| 2015/0270168 A1* | 9/2015 | Breil | H01L 21/76883 257/757 |

OTHER PUBLICATIONS

Kim et al., "Rapid Thermal process for enhancement of collimated titanium nitride barriers", Journal of Electrochemical Society vol. 144, pp. 664-668. Published by the Electrochemical Society, Inc. in 1997.*

Yamada et al., "Formation of metal silicide-silicon contact with ultralow contact resistance by silicon-capping silicidation technique", Applied Physics Letters vol. 64, p. 3449. Published by the AIP Publishing in 1994.*

* cited by examiner

*Primary Examiner* — Jesse Y Miyoshi
*Assistant Examiner* — Tuan A Hoang
(74) *Attorney, Agent, or Firm* — Heslin Rothenberg Farley & Mesiti P.C.; Kristian Ziegler

(57) ABSTRACT

Contact liners for integrated circuits and fabrication methods thereof are presented. The methods include: fabricating an integrated circuit structure having a first transistor having at least one of a p-type source region or a p-type drain region and a second transistor having at least one of an n-type source region or an n-type drain region, and the fabricating including: forming a contact liner at least partially over both the first transistor and the second transistor, the contact liner including a first contact liner material and a second contact liner material, wherein the first contact liner material is selected to facilitate electrical connection to the at least one p-type source region or p-type drain region of the first transistor, and the second contact liner material is selected to facilitate electrical connection to the at least one n-type source region or n-type drain region of the second transistor.

20 Claims, 12 Drawing Sheets

CONTACT LINERS FOR INTEGRATED CIRCUITS AND FABRICATION METHODS THEREOF

FIELD OF THE INVENTION

The present invention relates to semiconductor devices and semiconductor fabrication methods, and more particularly to contact liners for integrated circuits and fabrication methods thereof.

BACKGROUND OF THE INVENTION

Complementary metal-oxide-semiconductor (CMOS) technology continues to be an extremely important technology for the fabrication of integrated circuits such as microprocessors, memory circuits, and digital logic devices. In CMOS technology, both p-type devices, such as p-type field-effect transistors, and n-type devices, such as n-type field effect transistors, are fabricated on a common semiconductor wafer.

Some techniques employed in the fabrication of p-type devices may not be compatible with n-type devices, necessitating separate process steps for each type of devices. Therefore, a need exists for techniques that allow for common process steps applicable to both p-type devices and n-type devices.

BRIEF SUMMARY

The shortcomings of the prior art are overcome, and additional advantages are provided, through the provision, in one aspect, of a method. The method includes: fabricating an integrated circuit structure having a first transistor and a second transistor, the first transistor having at least one of a p-type source region or a p-type drain region and the second transistor having at least one of an n-type source region or an n-type drain region, and the fabricating including: forming a contact liner at least partially over both the first transistor and the second transistor, the contact liner including a first contact liner material and a second contact liner material, wherein the first contact liner material is selected to facilitate electrical connection to the at least one p-type source region or p-type drain region of the first transistor, and the second contact liner material is selected to facilitate electrical connection to the at least one n-type source region or n-type drain region of the second transistor.

In another aspect, an integrated circuit structure is presented. The integrated circuit structure includes: a first transistor and a second transistor, the first transistor having at least one of a p-type source region or a p-type drain region and the second transistor having at least one of an n-type source region or an n-type drain region; and a contact liner, the contact liner disposed at least partially over both the first transistor and the second transistor, the contact liner including a first contact liner material and a second contact liner material, wherein the first contact liner material is selected to facilitate electrical connection to the at least one p-type source region or p-type drain region of the first transistor, and the second contact liner material is selected to facilitate electrical connection to the at least one n-type source region or n-type drain region of the second transistor.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
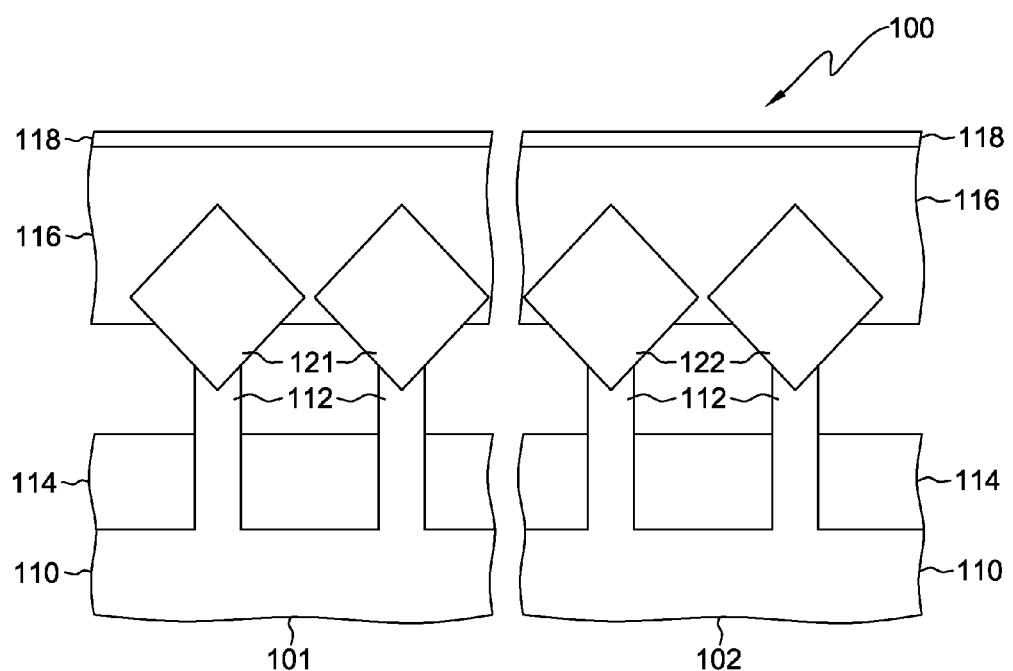
FIG. 1A is a cross-sectional elevational view of a structure obtained in an integrated circuit structure fabrication process, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure provides, at least in part, contact liners for integrated circuits and fabrication methods of the contact liners. In CMOS integrated circuits, multiple p-type semiconductor devices and n-type semiconductor devices, such as field-effect transistors are fabricated on a semiconductor wafer. After fabrication of semiconductor devices, conductive contacts are provided to enable wiring of the semiconductor devices with metal lines and vias. In order to allow electrical connection to the semiconductor devices, conductive contacts are formed to contact, for example, source regions, drain regions, and gate structures.

Source regions and drain regions are generally doped semiconductor regions, such as p-type regions or n-type regions. Conductive contacts formed directly on doped semiconductor regions can have a high contact resistance. To reduce contact resistance, contact liners can be formed between conductive contacts and doped semiconductor regions to facilitate electrical connection thereof.

For instance, a first process can be used to provide one contact liner for p-type source regions and p-type drain regions, and a second process can be used to provide another different contact liner for n-type source regions and n-type drain regions. Due to multiple steps of masking and removing masks in such processes, source regions and drain regions can be damaged, for example by gouging of epitaxial regions thereof.

Generally stated, provided herein, in one aspect, is a method for fabricating an integrated circuit structure having a first transistor and a second transistor, the first transistor having at least one of a p-type source region or a p-type drain region and the second transistor having at least one of an n-type source region or an n-type drain region. The fabricating includes: forming a contact liner at least partially over both the first transistor and the second transistor, the contact liner including a first contact liner material and a second contact liner material, wherein the first contact liner material is selected to facilitate electrical connection to the at least one p-type source region or p-type drain region of the first transistor, and the second contact liner material is selected to facilitate electrical connection to the at least one n-type source region or n-type drain region of the second transistor.

In one embodiment, a contact resistance of the first contact liner material and the at least one p-type source region or p-type drain region is less than another contact resistance of the first contact liner material and the at least one n-type source region or n-type drain region. In another embodiment, a contact resistance of the second contact liner material and the at least one n-type source region or n-type drain region is less than another contact resistance of the second contact liner material and the at least one p-type source region or p-type drain region. In a further embodiment, the method further includes: forming a conductive contact over the contact liner, wherein the first contact liner material facilitates electrical connection of the conductive contact and the at least one p-type source region or p-type drain region and the second contact liner material facilitates electrical connection of the conductive contact and the at least one n-type source region or n-type drain region.

In one implementation, forming the contact liner includes: providing an alternating pattern of the first contact liner material and the second contact liner material over both the at least one p-type source region or p-type drain region and the at least one n-type source region or n-type drain region. In another implementation, the forming includes: providing the first contact liner material over a first surface of the at least one p-type source region or p-type drain region and a second surface of the at least one n-type source region or n-type drain region; and providing the second contact liner material over a third surface of the at least one p-type source region or p-type drain region and a fourth surface of the at least one n-type source region or n-type drain region. In a further implementation, the forming includes: providing the first contact liner material at least partially over the at least one p-type source region or p-type drain region and at least partially over the at least one n-type source region or n-type drain region; removing a portion of the first contact liner material to reveal a first surface of the at least one p-type source region or p-type drain region and a second surface of the at least one n-type source region or n-type drain region; and providing the second contact liner material at least partially over the first surface of the at least one p-type source region or p-type drain region and at least partially over the second surface of the at least one n-type source region or n-type drain region.

In one example, the forming includes using a single mask step in forming the first contact liner material and the second contact liner material of the contact liner. In another example, the first contact liner material includes titanium and the second contact liner material includes a silicide. In a further example, the forming includes annealing at least one of the first contact liner material or the second contact liner material.

In one embodiment, the at least one p-type source region or p-type drain region includes a first diamond shaped structure and the at least one n-type source region or n-type drain region includes a second diamond shaped structure, and the forming includes: providing the first contact liner material at least partially over a first surface of the first diamond shaped structure and at least partially over a second surface of the second diamond shaped structure, and the second contact liner material at least partially over a third surface of the first diamond shaped structure and at least partially over a fourth surface of the second diamond shaped structure.

In another embodiment, the forming includes: providing the first contact liner material at least partially over an upper portion of the at least one p-type source region or p-type drain region and at least partially over an upper portion of the at least one n-type source region or n-type drain region, and the second contact liner material at least partially over a lower portion of the at least one p-type source region or p-type drain region and a lower portion of the at least one n-type source region or n-type drain region.

In a further embodiment, the forming includes: providing the first contact liner material at least partially over a first surface of the at least one p-type source region or p-type drain region and at least partially over a second surface of the at least one n-type source region or n-type drain region, and the second contact liner material at least partially over a third surface of the at least one p-type source region or p-type drain region and a fourth surface of the at least one n-type source region or n-type drain region, wherein the first surface and the second surface face one direction, and the third surface and the fourth surface face another direction, the one direction and the another direction being different directions.

In another aspect, an integrated circuit structure is presented. The integrated circuit structure includes: a first transistor and a second transistor, the first transistor having at least one of a p-type source region or a p-type drain region and the second transistor having at least one of an n-type source region or an n-type drain region; and a contact liner, the contact liner disposed at least partially over both the first transistor and the second transistor, the contact liner including a first contact liner material and a second contact liner material, wherein the first contact liner material is selected to facilitate electrical connection to the at least one p-type source region or p-type drain region of the first transistor, and the second contact liner material is selected to facilitate electrical connection to the at least one n-type source region or n-type drain region of the second transistor.

In one embodiment, the structure includes a conductive contact disposed over the contact liner, wherein the first contact liner material facilitates electrical connection of the conductive contact and the at least one p-type source region or p-type drain region and the second contact liner material facilitates electrical connection of the conductive contact and the at least one n-type source region or n-type drain region.

In another embodiment, the contact liner includes an alternating pattern of the first contact liner material and the second contact liner material disposed over both the at least one p-type source region or p-type drain region and the at least one n-type source region or n-type drain region.

In a further embodiment, the first contact liner material is disposed over a first surface of the at least one p-type source region or p-type drain region and a second surface of the at least one n-type source region or n-type drain region, and the second contact liner material is disposed over a third surface of the at least one p-type source region or p-type drain region and a fourth surface of the at least one n-type source region or n-type drain region.

In one implementation, the at least one p-type source region or p-type drain region includes a first diamond shaped structure and the at least one n-type source region or n-type drain region includes a second diamond shaped structure, wherein the first contact liner material is disposed at least partially over a first surface of the first diamond shaped structure and at least partially over a second surface of the second diamond shaped structure, and the second contact liner material is disposed at least partially over a third surface of the first diamond shaped structure and at least partially over a fourth surface of the second diamond shaped structure.

In another implementation, the first contact liner material is disposed at least partially over an upper portion of the at least one p-type source region or p-type drain region and at least partially over an upper portion of the at least one n-type source region or n-type drain region, and the second contact liner material is disposed at least partially over a lower portion of the at least one p-type source region or p-type drain region and a lower portion of the at least one n-type source region or n-type drain region.

In a further implementation, the first contact liner material is disposed at least partially over a first surface of the at least one p-type source region or p-type drain region and at least partially over a second surface of the at least one n-type source region or n-type drain region, and the second contact liner material is disposed at least partially over a third surface of the at least one p-type source region or p-type drain region and a fourth surface of the at least one n-type source region or n-type drain region, wherein the first surface and the second surface face one direction, and the third surface and the fourth surface face another direction, the one direction and the another direction being different directions.

Reference is made below to the drawings, which are not drawn to scale for ease of understanding, wherein the same reference numbers used throughout different figures designate the same or similar components.

FIG. 1A is a cross-sectional elevational view of an intermediate structure 100 obtained in an integrated circuit structure fabrication process, in accordance with one or more aspects of the present invention. By way of example, in the fabrication of an integrated circuit, thousands, millions, billions, or more semiconductor devices, such as field-effect transistors, may be formed on a substrate 110, such as a semiconductor substrate. For example, some semiconductor devices may be p-type devices, formed in a p-type portion 101 of structure 100 and other semiconductor devices may be n-type devices, formed in an n-type portion 102 of structure 100. In another embodiment, substrate 101 may be or include any silicon-containing substrate material including, but not limited to, single crystal Si, polycrystalline Si, amorphous Si, Si-on-nothing (SON), Si-on-insulator (SOI), or Si-on-replacement insulator (SRI) substrates. In one example, the substrate may be or include other suitable elementary semiconductors, such as, for example, germanium (Ge) in crystal, or a compound semiconductor such as silicon carbide (SiC), gallium arsenide (GaAs), gallium phosphide (GaP), indium phosphide (InP), indium arsenide (InAs), and/or indium antimonide (InSb) or combinations thereof, or an alloy semiconductor such as GaAsP, AlInAs, GaInAs, GaInP, or GaInAsP or combinations thereof. In another example, the substrate may be an n-type or p-type doped semiconductor material.

In one embodiment, multiple fins 110 extend from substrate 101, and an isolation material 114 may be disposed between fins, to provide, for example, electrical isolation. Semiconductor devices, such as fin-type field-effect transistors may be formed on and/or within fins 110. Fin-type field-effect transistors make use of three dimension structures, such as fins 110, from which source regions, drain regions, and channel regions may be formed.

For example, p-type semiconductor devices such as p-type fin-type field-effect transistors can be formed in p-type portion 101, and can include at least one p-type source region or p-type drain region 121. In addition, n-type semiconductor devices such as n-type fin-type field-effect transistors can be formed in n-type portion 102, and can include at least one n-type source region or n-type drain region 122.

In another embodiment, at least one p-type source region or p-type drain region 121 and at least one n-type source region or n-type drain region 122 are diamond shaped structures. In one example, the diamond shaped structures can be formed by forming cavities in the fins and epitaxially growing a semiconductor material from one or more surfaces of the cavities. Advantageously, the diamond shaped structures can exert stresses, such as compressive or tensile stresses, on channel regions of the fins. Epitaxial growth refers to the orderly growth of a crystalline material from a substrate, where the grown material arranges itself in the same crystal orientation as the underlying substrate. In one example, epitaxial growth occurs from either one or more surfaces of a cavity formed in the substrate, including, for example, a {111} plane, a {110} plane, and a {100} plane. Portions can be epitaxially grown using selective epitaxial growth via various methods, such as, for example, vapor-phase epitaxy (VPE), a modification of chemical vapor deposition (CVD), molecular-beam epitaxy (MBE), and/or liquid-phase epitaxy (LPE), or other applicable methods.

In a further embodiment, an isolation material 116 is disposed over at least one p-type source region or p-type drain region 121 and at least one n-type source region or n-type drain region 122. In such a case, a cap layer 118 may be disposed over isolation material 116. As illustrated, air gaps can be present between isolation material 114 and isolation material 116, because of the deposition process of the isolation material. In such a case, subsequent process steps, such as etching steps, can lead to damage or gouging of the at least one p-type source region or p-type drain region 121 and at least one n-type source region or n-type drain region 122, because etchants can flow through and reach underneath at least one p-type source region or p-type drain region 121 and at least one n-type source region or n-type drain region 122. Advantageously, the present techniques, in part, reduce etching steps, thereby reducing damage or gouging of at least one p-type source region or p-type drain region 121 and at least one n-type source region or n-type drain region 122.

Figure 1B:
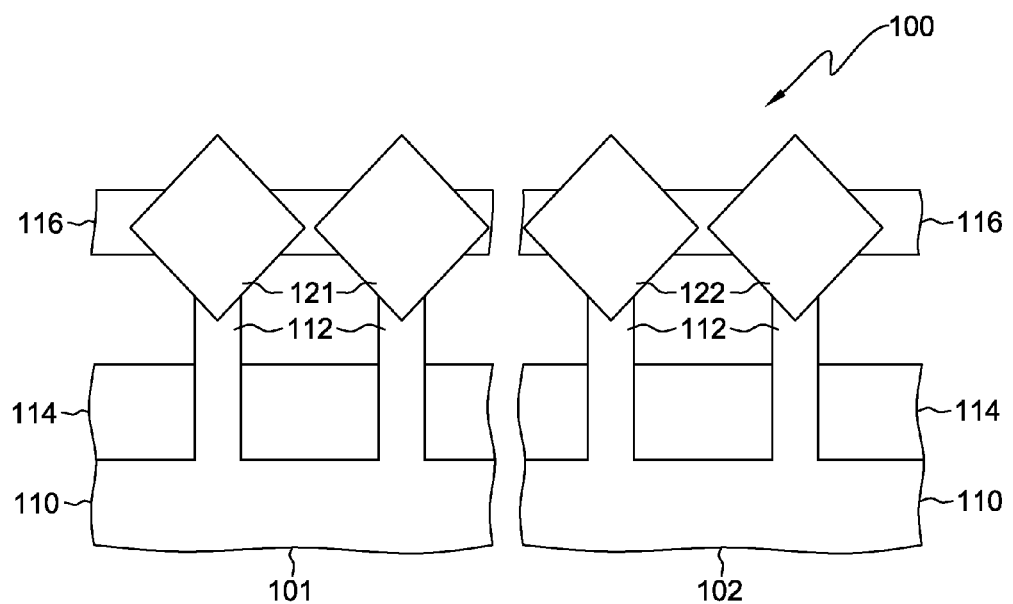
FIG. 1B is a cross-sectional elevational view of the structure of FIG. 1A after recessing an isolation material to reveal at least one p-type source region or p-type drain region and at least one n-type source region and n-type drain region, in accordance with one or more aspects of the present invention.

FIG. 1B is a cross-sectional elevational view of the structure of FIG. 1A after recessing isolation material 116 to reveal at least one p-type source region or p-type drain region 121 and at least one n-type source region and n-type drain region 122, in accordance with one or more aspects of the present invention. As illustrated, an upper portion of at least one p-type source region or p-type drain region 121 and an upper portion of at least one n-type source region or n-type drain region 122 have been revealed. Isolation material 116 may be recessed using any suitable etching process. For example, any of the following etching technologies may be used: reactive ion etching (RIE), plasma etching, dry etching, or wet etching, using one or more of tetrafluoromethane ($CF_4$), sulfur hexafluoride ($SF_6$), boron chloride, ($BCl_3$), nitrogentrifluoride ($NF_3$), potassium hydroxide (KOH), or tetra-methyl-ammonium hydroxide (TMAH).

Figure 1C:
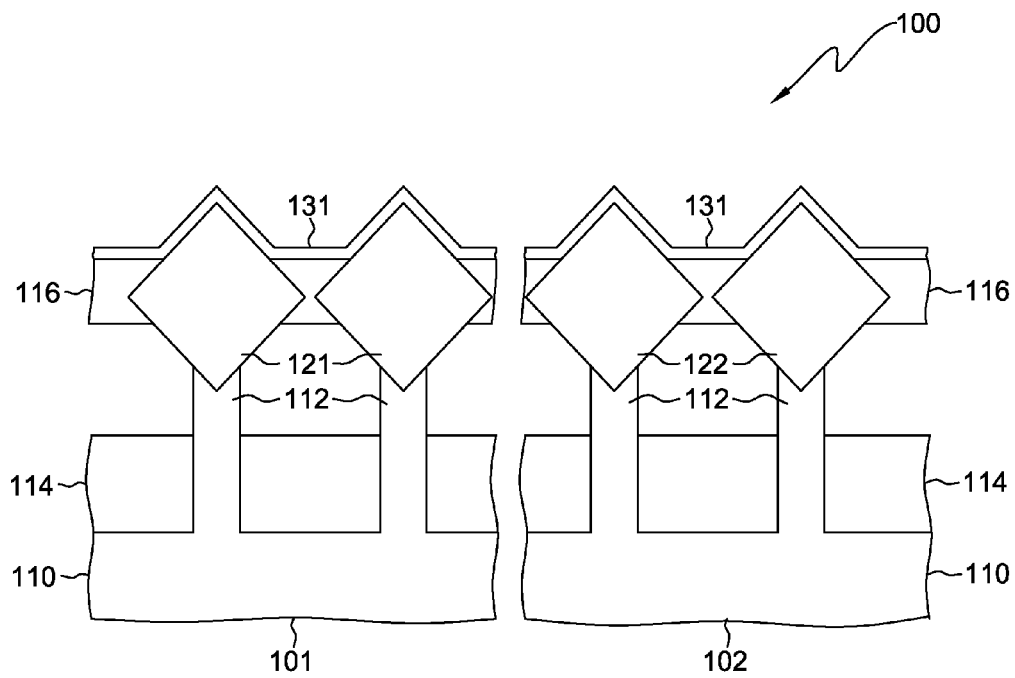
FIG. 1C is a cross-sectional elevational view of the structure of FIG. 1B after providing a first contact liner material of a contact liner over a surface of the at least one p-type source region or p-type drain region and another surface of the at least one n-type source region or n-type drain region, in accordance with one or more aspects of the present invention.

FIG. 1C is a cross-sectional elevational view of the structure of FIG. 1B after providing a first contact liner material 131 of a contact liner over a surface of at least one p-type source region or p-type drain region 121 and another surface of at least one n-type source region or n-type drain region 122, in accordance with one or more aspects of the present invention. In one embodiment, first contact liner material 131 can be any material capable of facilitating electrical connection to a p-type material. In one example, if at least one p-type source region or p-type drain region 121 includes silicon and/or germanium, first contact liner material 131 may be a metal, such as nickel, platinum, or an alloy thereof.

Figure 1D:
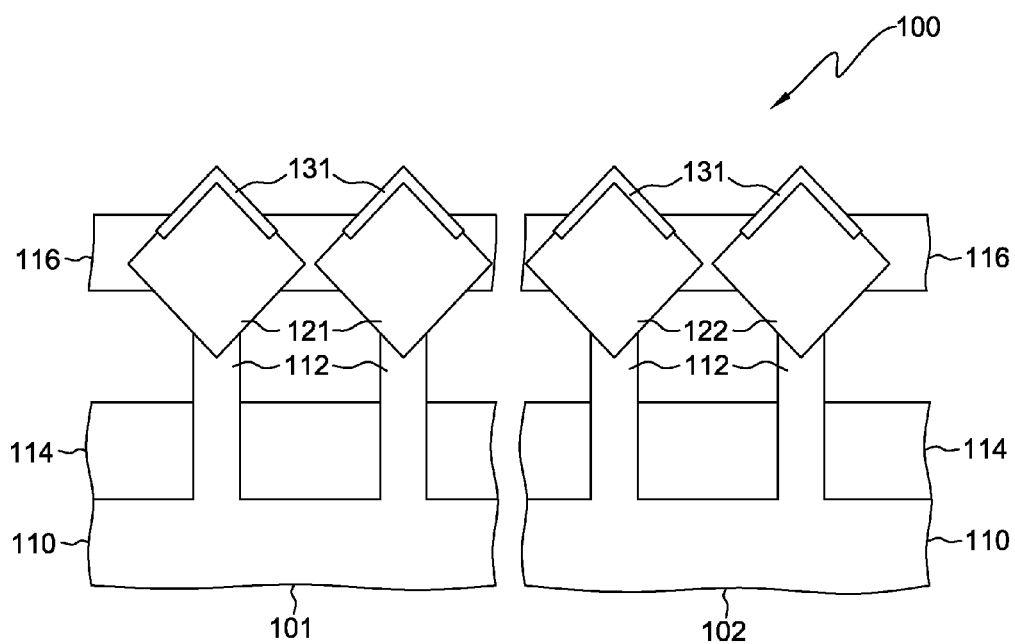
FIG. 1D is a cross-sectional elevational view of the structure of FIG. 1C after annealing the first contact liner material, in accordance with one or more aspects of the present invention.

FIG. 1D is a cross-sectional elevational view of the structure of FIG. 1C after annealing first contact liner material 131 and selectively removing un-reacted portions thereof, in accordance with one or more aspects of the present invention. In one embodiment, first contact liner material 131 reacts, during the annealing, with at least one p-type source region or p-type drain region 121 and at least one n-type source region or n-type drain region 122 to become a silicide material. In such a case, the silicide material may be nickel silicide, platinum silicide, or nickel platinum silicide. In such a case, a contact resistance of first contact liner material 131 at least one p-type source region or p-type drain region 121 can be less than another contact resistance of first contact liner material 131 and at least one n-type source region or n-type drain region 122. For example, the contact resistance $R_{Ni}^p$ of nickel silicide and a p-type region can be approximately 20 ohms, and the contact resistance $R_{Ni}^n$ of nickel silicide and an n-type region can be approximately 100 ohms. Portions of first contact liner material 131 disposed over isolation material 116 will not react to form a silicide, and as illustrated, have been removed by, for example, a selective etching process that can remove the un-reacted material such as nickel or platinum, without removing the reacted material such as a silicide.

Figure 1E:
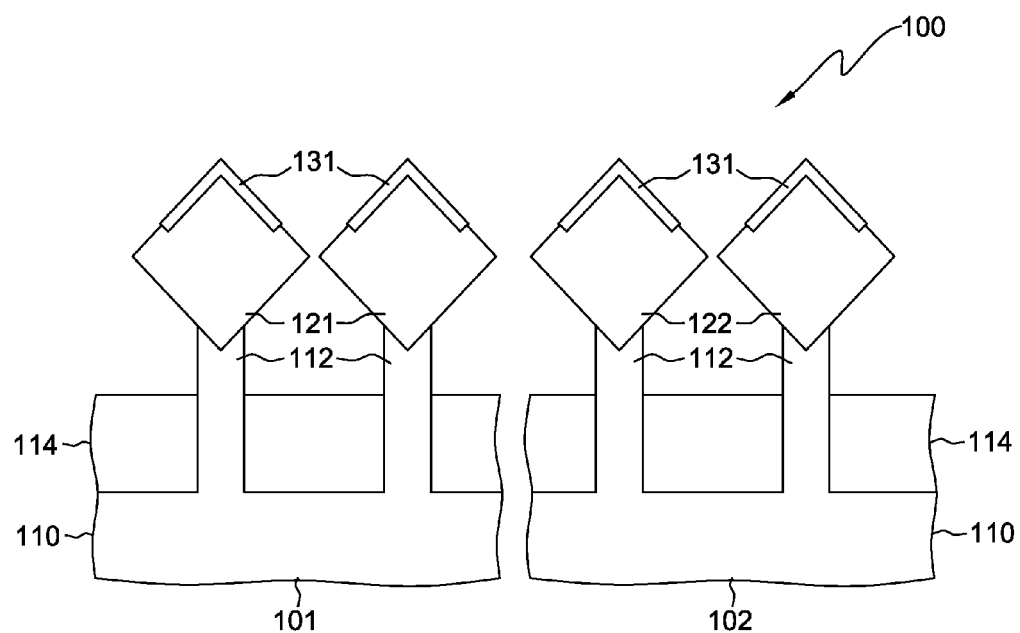
FIG. 1E is a cross-sectional elevational view of the structure of FIG. 1D after further recessing an isolation material thereof, in accordance with one or more aspects of the present invention.

FIG. 1E is a cross-sectional elevational view of the structure of FIG. 1D after further recessing the isolation material thereof, in accordance with one or more aspects of the present invention. The isolation material may be recessed using any suitable etching process.

Figure 1F:
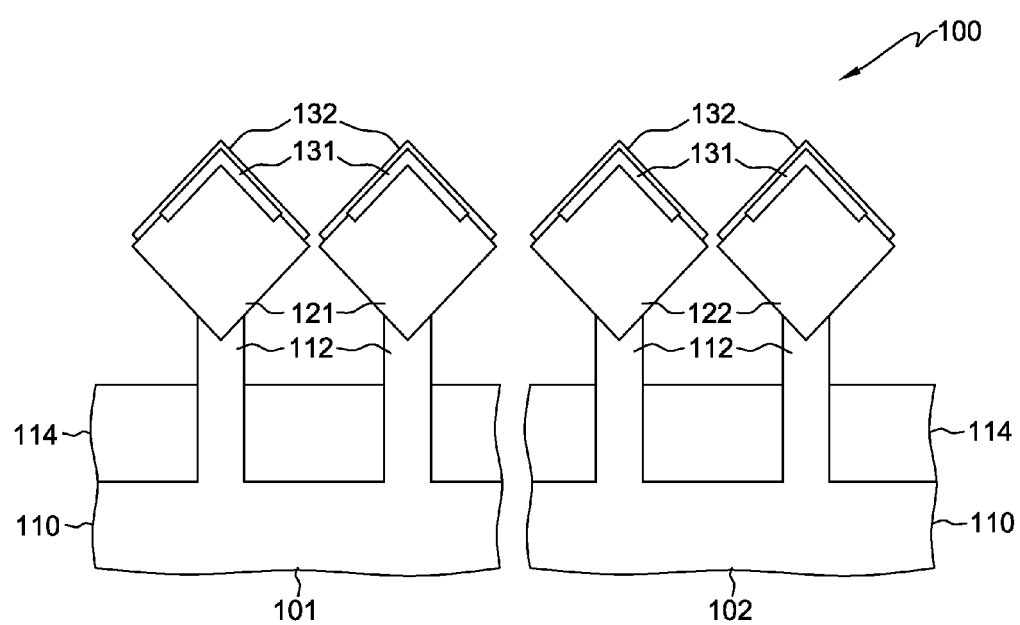
FIG. 1F is a cross-sectional elevational view of the structure of FIG. 1E after providing a second contact liner material of the contact liner over a surface of the at least one p-type source region or p-type drain region and another surface of the at least one n-type source region or n-type drain region, in accordance with one or more aspects of the present invention.

FIG. 1F is a cross-sectional elevational view of the structure of FIG. 1E after providing a second contact liner material 132 of the contact liner over a surface of at least one p-type source region or p-type drain region 121 and another surface of at least one n-type source region or n-type drain region 122, in accordance with one or more aspects of the present invention. In one embodiment, second contact liner material 132 can be any material capable of facilitating electrical connection to an n-type material. In one example, if at least one n-type source region or n-type drain region 122 includes silicon and/or germanium, second contact liner material 132 may be or include titanium. In such a case, a contact resistance of second contact liner material 132 at least one n-type source region or n-type drain region 122 can be less than another contact resistance of second contact liner material 132 and at least one p-type source region or p-type drain region 121. In another example, although the second contact liner material can overlap the first contact liner material, the contact resistance can be determined by the material that is in direct contact with the source or drain region.

In one embodiment, the contact resistance $R_{Ti}^n$ of titanium and an n-type region can be approximately 20 ohms, and the contact resistance $R_{Ti}^p$ of titanium and a p-type region can be approximately 120 ohms. This example can be combined with the example discussed with respect to FIG. 1D. In such a combined example, assuming the contact area of each contact liner material is half the total contact area of the contact liner, the total contact resistance of the contact liner and at least one p-type source region or p-type drain region 121 is given by $$R_{Total}^p = \frac{2R_{Ni}^p \times 2R_{Ti}^p}{2R_{Ni}^p + 2R_{Ti}^p} = 34.3 \text{ ohms.}$$

Similarly, the total contact resistance of the contact liner and at least one n-type source region or n-type drain region 122 is given by $$R_{Total}^n = \frac{2R_{Ni}^n \times 2R_{Ti}^n}{2R_{Ni}^n + 2R_{Ti}^n} = 33.3 \text{ ohms.}$$

Advantageously, in such a case, the contact liner with first contact liner material 131 and second contact liner 132 can facilitate electrical connection to either or both of at least one p-type source region or p-type drain region 121 and at least one n-type source region or n-type drain region 122.

For example, a 33 to 34 ohm contact offers a lower contact resistance than either a 100 to 120 ohm contact.

Figure 1G:
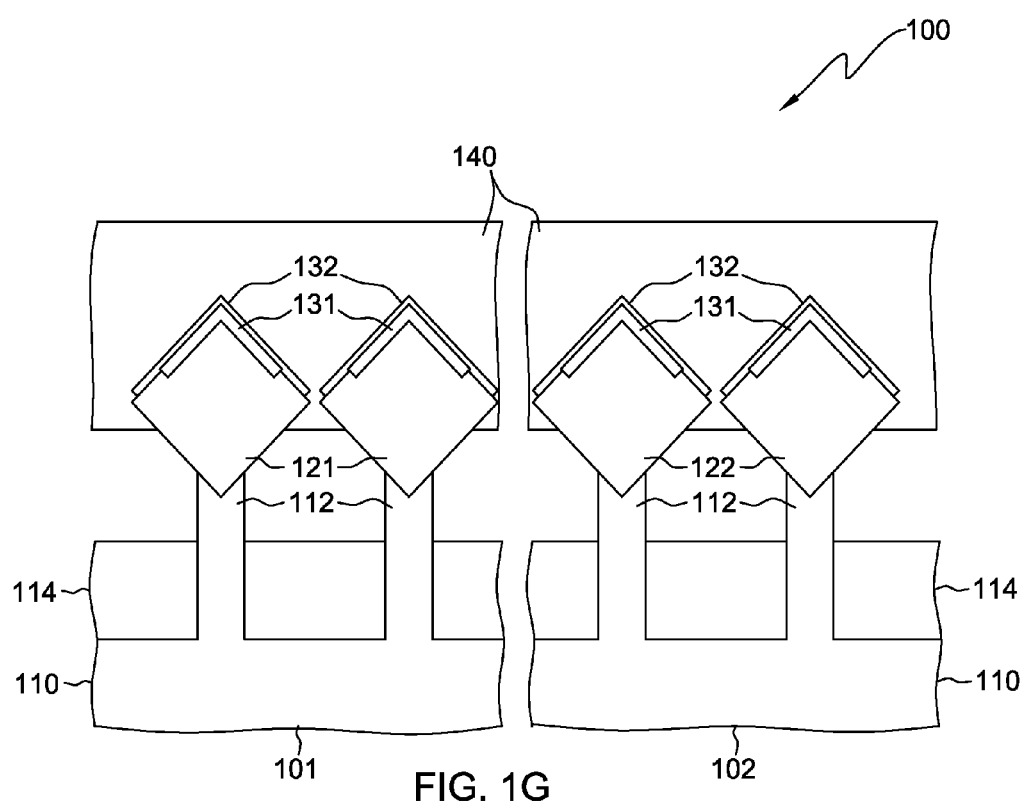
FIG. 1G is a cross-sectional elevational view of the structure of FIG. 1F after forming a conductive contact over the contact liner, in accordance with one or more aspects of the present invention.

FIG. 1G is a cross-sectional elevational view of the structure of FIG. 1F after forming a conductive contact 140 over the contact liner, in accordance with one or more aspects of the present invention. Conductive contact 140 may be any conductive material, including a metal, such as aluminum, copper, or tungsten. Any suitable deposition process may be used to form conductive contact 140.

In one example, first contact liner material 131 facilitates electrical connection of conductive contact 140 and at least one p-type source region or p-type drain region 121. In another example, second contact liner material 132 facilitates electrical connection of conductive contact 140 and at least one n-type source region or n-type drain region 122.

FIGS. 2A-2G illustrate a process for fabricating a contact liner for an integrated circuit, in accordance with one or more aspects of the present invention.

Figure 2A:
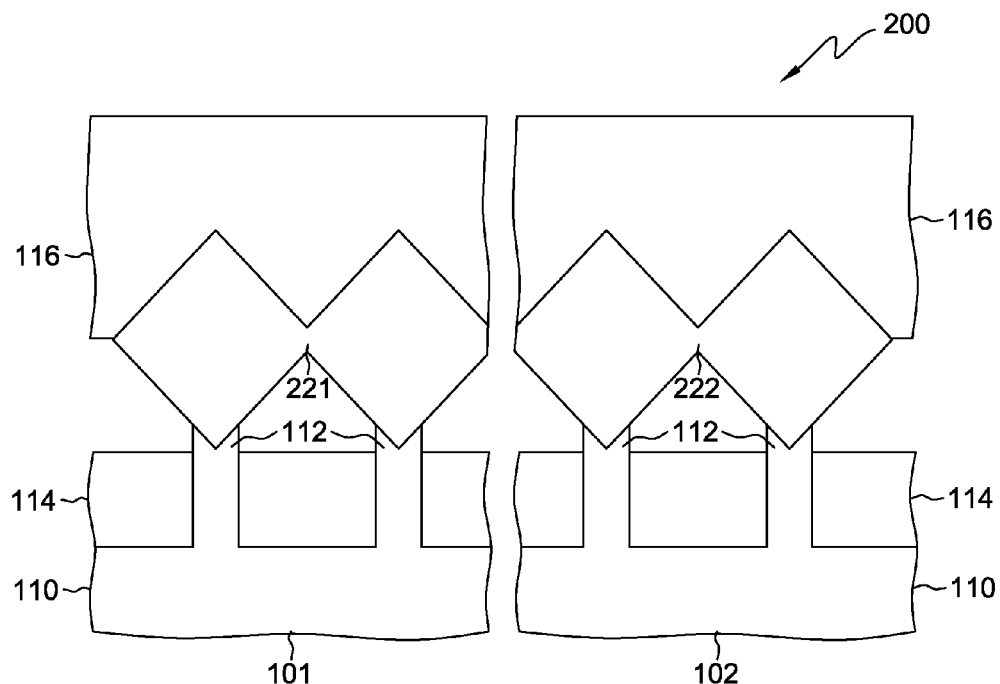
FIG. 2A is a cross-sectional elevational view of a structure obtained in an integrated circuit structure fabrication process, in accordance with one or more aspects of the present invention.
Figure 2B:
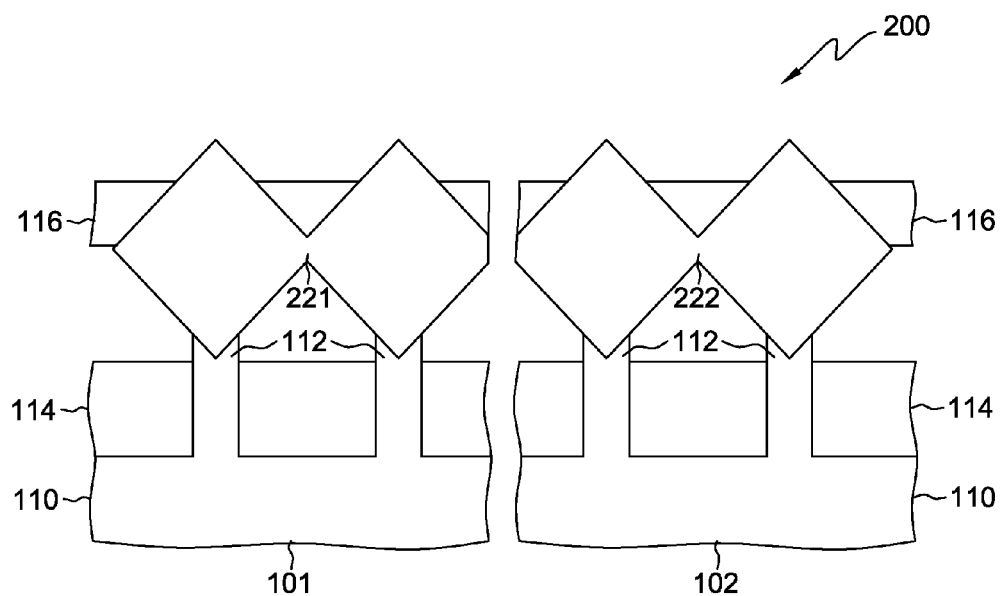
FIG. 2B is a cross-sectional elevational view of the structure of FIG. 2A after recessing an isolation material to reveal at least one p-type source region or p-type drain region and at least one n-type source region and n-type drain region, in accordance with one or more aspects of the present invention.
Figure 2C:
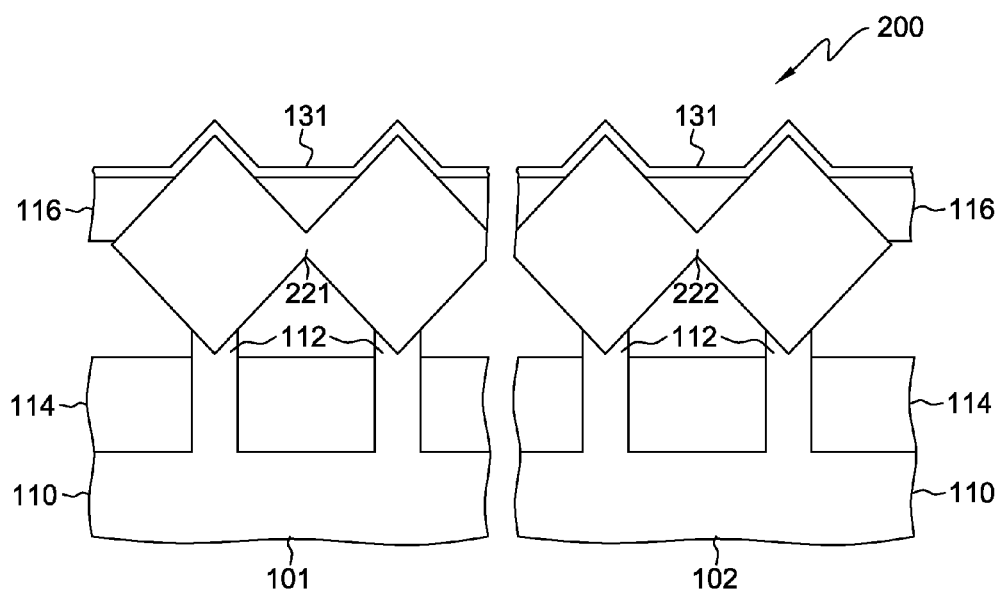
FIG. 2C is a cross-sectional elevational view of the structure of FIG. 2B after providing a first contact liner material of a contact liner over a surface of the at least one p-type source region or p-type drain region and another surface of the at least one n-type source region or n-type drain region, in accordance with one or more aspects of the present invention.
Figure 2D:
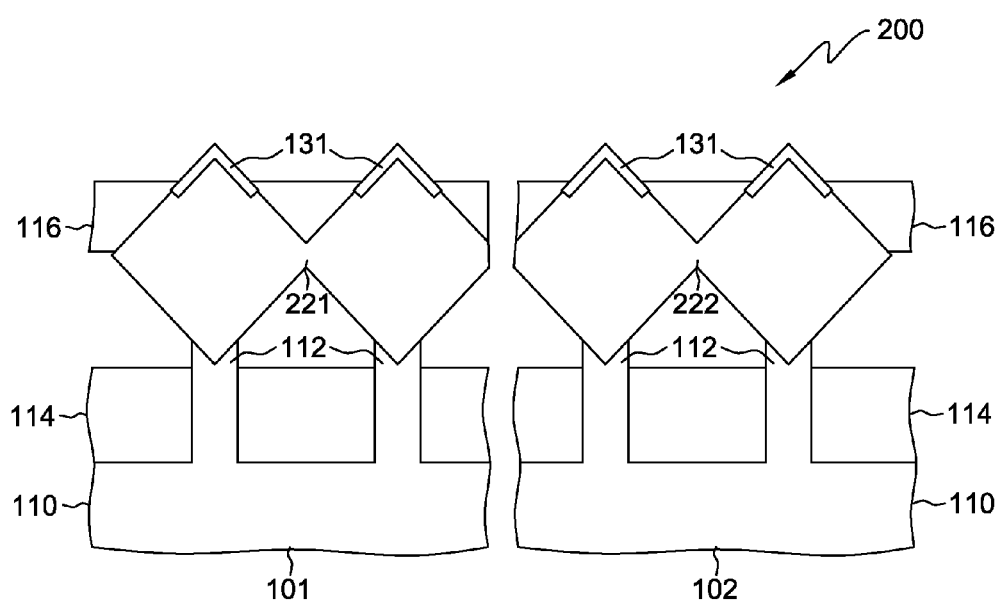
FIG. 2D is a cross-sectional elevational view of the structure of FIG. 2C after annealing the first contact liner material, in accordance with one or more aspects of the present invention.
Figure 2E:
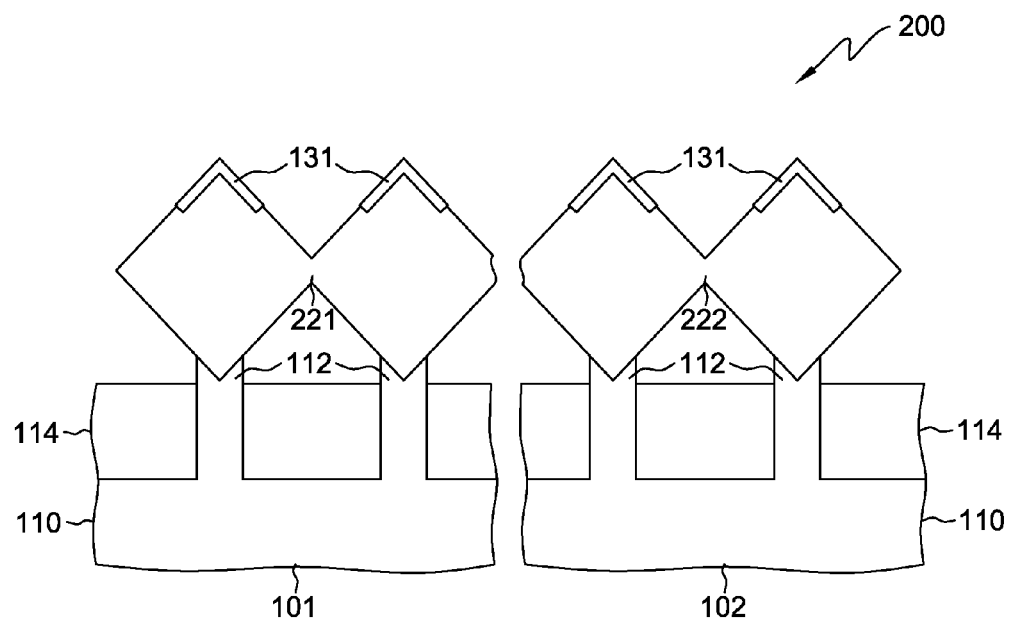
FIG. 2E is a cross-sectional elevational view of the structure of FIG. 2D after further recessing an isolation material thereof, in accordance with one or more aspects of the present invention.
Figure 2F:
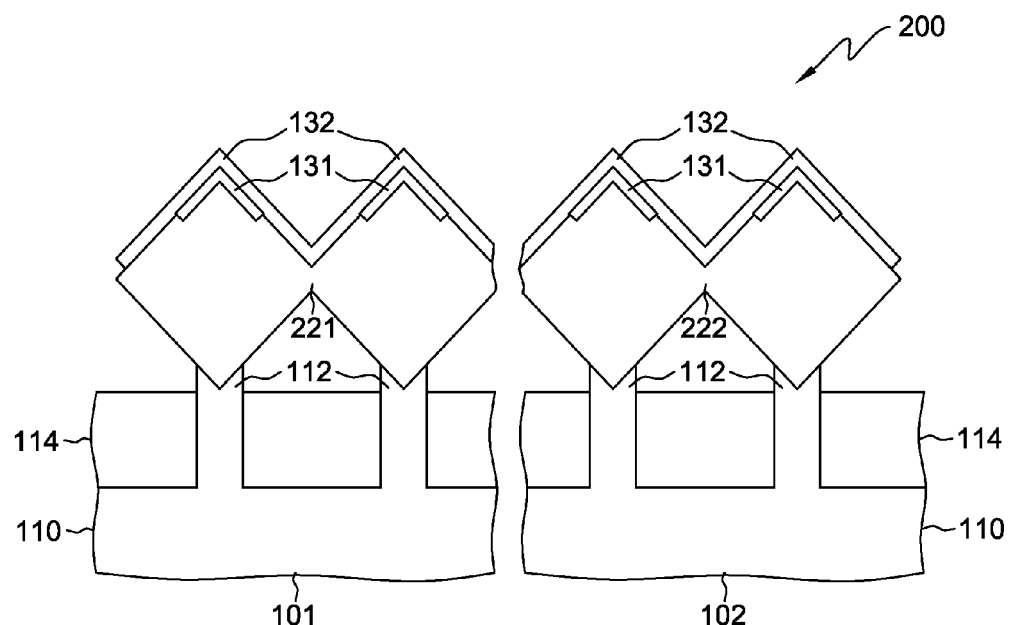
FIG. 2F is a cross-sectional elevational view of the structure of FIG. 2E after providing a second contact liner material of the contact liner over a surface of the at least one p-type source region or p-type drain region and another surface of the at least one n-type source region or n-type drain region, in accordance with one or more aspects of the present invention.
Figure 2G:
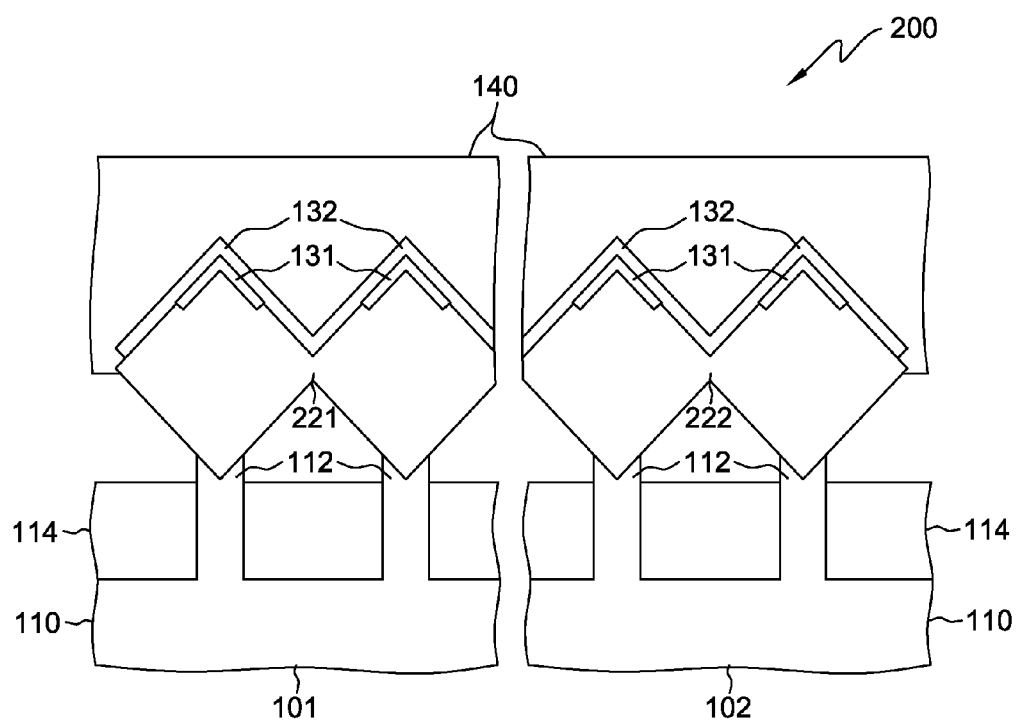
FIG. 2G is a cross-sectional elevational view of the structure of FIG. 2F after forming a conductive contact over the contact liner, in accordance with one or more aspects of the present invention.

FIG. 2A is a cross-sectional elevational view of a structure 200 obtained in an integrated circuit structure fabrication process, in accordance with one or more aspects of the present invention. With reference to FIG. 2A, at least one p-type source region or p-type drain region 221 includes two diamond shaped epitaxial regions which have merged together during epitaxial growth. For instance, at least one p-type source region or p-type drain region 221 can be the source region or drain region of a fin-type field effect transistor that includes multiple fins 112. In addition, at least one n-type source region or n-type drain region 222 includes two diamond shaped epitaxial regions which have merged together during epitaxial growth. Further, in the embodiment of FIG. 2A, at least one p-type source region or p-type drain region 221 and at least one n-type source region or n-type drain region 222 can extend along fin 112 from an upper portion of isolation material 114 to isolation material 116. Advantageously, a multiple fin transistor and/or larger source/drain regions can allow for better performance of the transistor, including, for example, a greater on-current.

FIGS. 3A-3D illustrate a process for fabricating a contact liner for an integrated circuit, in accordance with one or more aspects of the present invention.

Figure 3A:
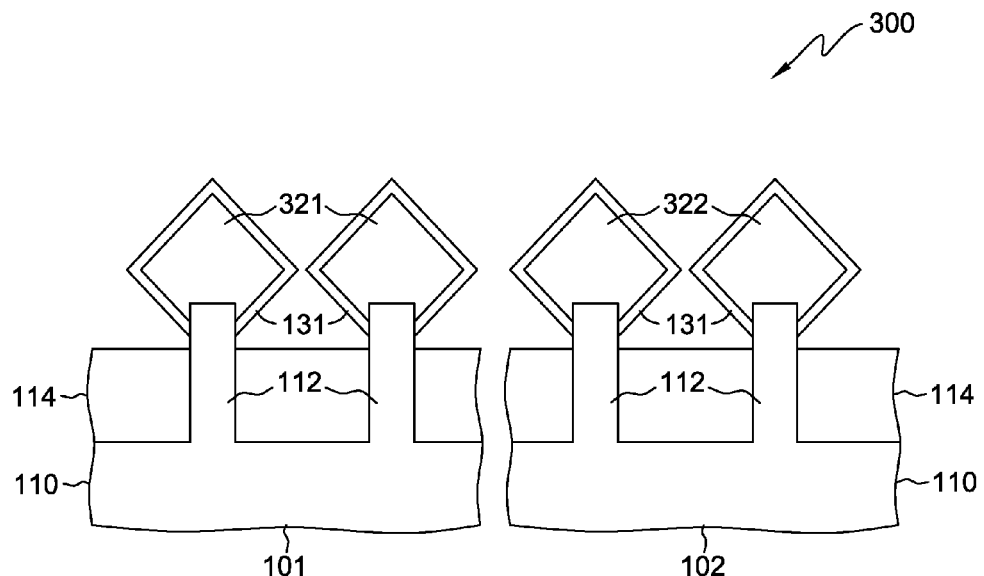
FIG. 3A is a cross-sectional elevational view of a structure obtained in an integrated circuit structure fabrication process, in accordance with one or more aspects of the present invention.

FIG. 3A is a cross-sectional elevational view of a structure 300 obtained in an integrated circuit structure fabrication process, in accordance with one or more aspects of the present invention. In the illustrated embodiment, a first contact liner material 131 of a contact liner is provided at least partially over at least one p-type source region or p-type drain region 321 and at least partially over at least one n-type source region or n-type drain region 322. For instance, chemical vapor deposition can be used to deposit first contact liner 131 all around epitaxial source or drain regions.

In one example, first contact liner material 131 is provided over upper portions of at least one p-type source region or p-type drain region 321 and at least one n-type source region or n-type drain region 322. In another example, first contact liner material 131 is provided over lower portions of at least one p-type source region or p-type drain region 321 and at least one n-type source region or n-type drain region 322.

Figure 3B:
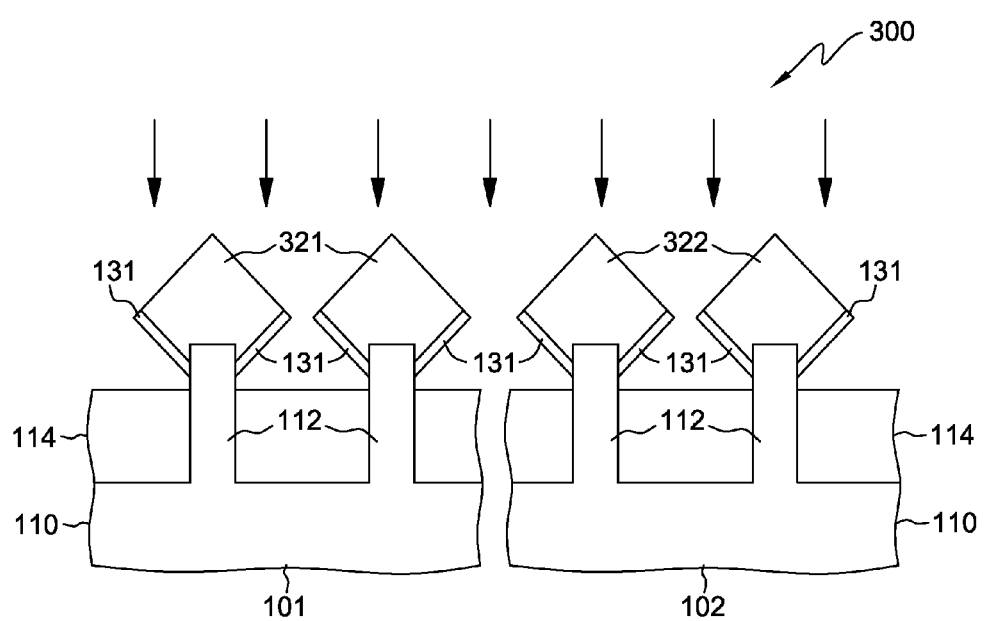
FIG. 3B is a cross-sectional elevational view of the structure of FIG. 3A after removing a portion of a first contact liner material to reveal a surface of at least one p-type source region or p-type drain region and another surface of at least one n-type source region and n-type drain region, in accordance with one or more aspects of the present invention.

FIG. 3B is a cross-sectional elevational view of the structure of FIG. 3A after removing a portion of first contact liner material 131 to reveal a surface of at least one p-type source region or p-type drain region 321 and another surface of at least one n-type source region and n-type drain region 322, in accordance with one or more aspects of the present invention. Any suitable deposition process may be used to provide the first contact liner material.

In one example, first contact liner material 131 is removed from upper portions of at least one p-type source region or p-type drain region 321 and at least one n-type source region or n-type drain region 322. In such a case, upper surfaces of at least one p-type source region or p-type drain region 321 and at least one n-type source region or n-type drain region 322 can be revealed. Any suitable etching process, such as a directional etching process, may be used to remove the first contact liner material.

Figure 3C:
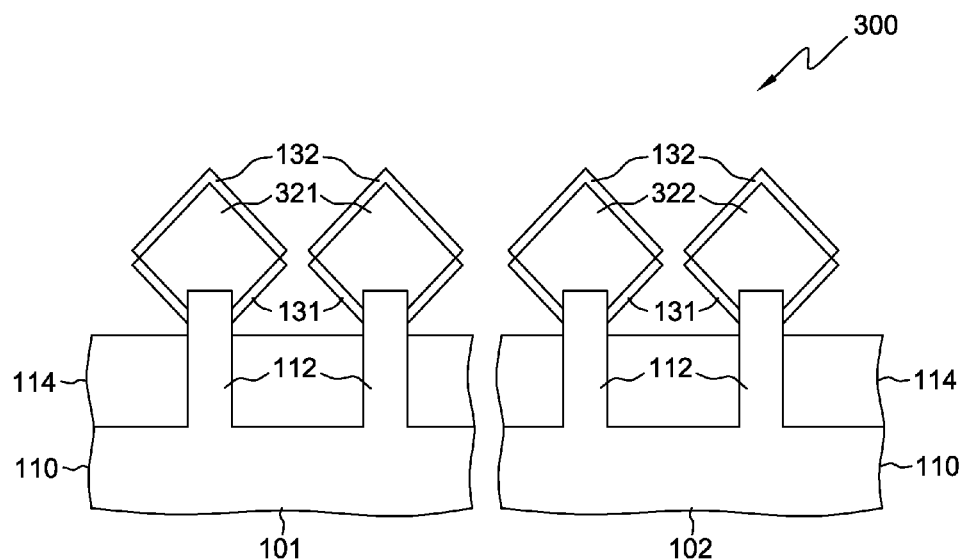
FIG. 3C is a cross-sectional elevational view of the structure of FIG. 3B after providing a second contact liner material of the contact liner over a surface of the at least one p-type source region or p-type drain region and another surface of the at least one n-type source region or n-type drain region, in accordance with one or more aspects of the present invention.

FIG. 3C is a cross-sectional elevational view of the structure of FIG. 3B after providing a second contact liner material 132 of the contact liner at least partially over a surface of at least one p-type source region or p-type drain region 321 and at least partially over another surface of at least one n-type source region or n-type drain region 322, in accordance with one or more aspects of the present invention. In such a case, the first contact liner material can be located on lower surfaces or portions of the source or drain regions, and the second contact liner material can be located on upper surfaces or portions of the source or drain regions.

Figure 3D:
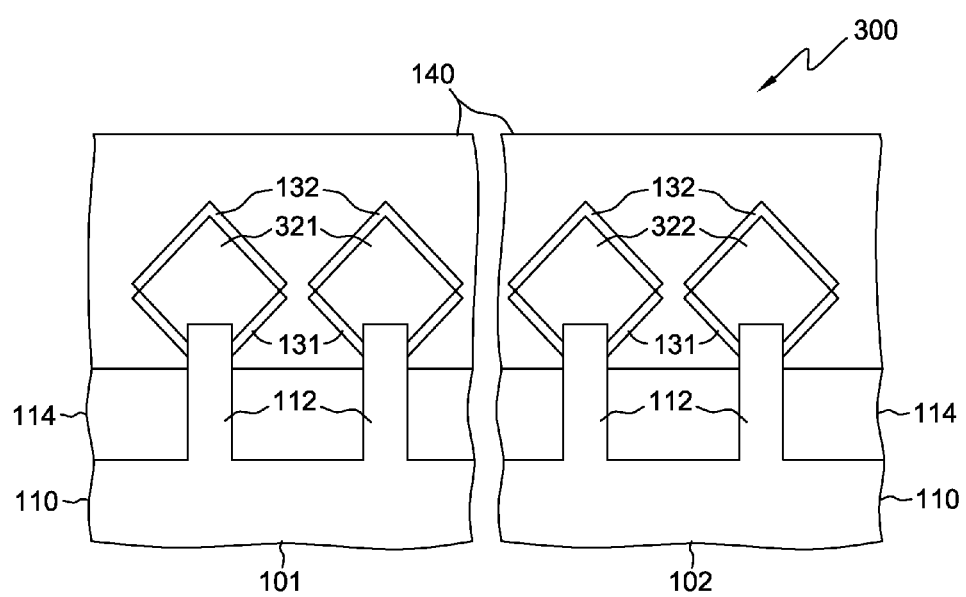
FIG. 3D is a cross-sectional elevational view of the structure of FIG. 3C after forming a conductive contact over the contact liner, in accordance with one or more aspects of the present invention.

FIG. 3D is a cross-sectional elevational view of the structure of FIG. 3C after forming a conductive contact 140 over the contact liner, in accordance with one or more aspects of the present invention. In the illustrated embodiment, conductive contact 140 contacts both upper portions or surfaces and lower portions or surfaces of at least one p-type source region or p-type drain region 321 and at least one n-type source region or n-type drain region 322. Advantageously, in a case where the areas of the first and second contact liners are equal, such a configuration allows for the contact liner to have contact resistances for p-type or n-type regions as described with respect to FIG. 1F.

Figure 4A:
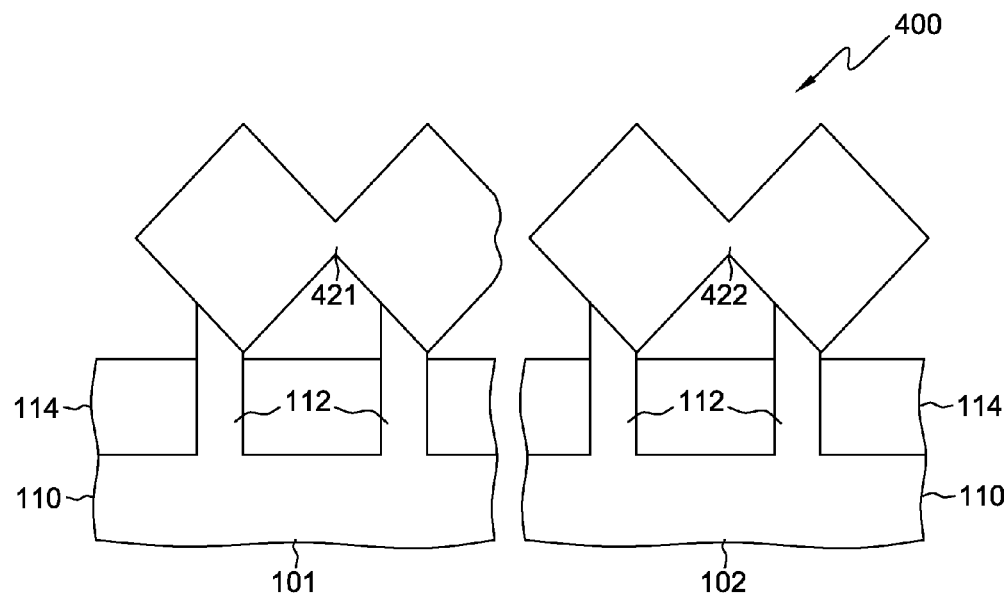
FIG. 4A is a cross-sectional elevational view of a structure obtained in an integrated circuit structure fabrication process, in accordance with one or more aspects of the present invention.

FIG. 4A is a cross-sectional elevational view of a structure 400 obtained in an integrated circuit structure fabrication process, in accordance with one or more aspects of the present invention. In the illustrated embodiment, an integrated circuit includes at least one p-type source region or p-type drain region 421 and at least one n-type source region or n-type drain region 422, and each of the source and drain regions includes more than one diamond shaped structure which has merged, for example, during epitaxial growth. In another embodiment, the diamond shaped structures may not be merged.

Figure 4B:
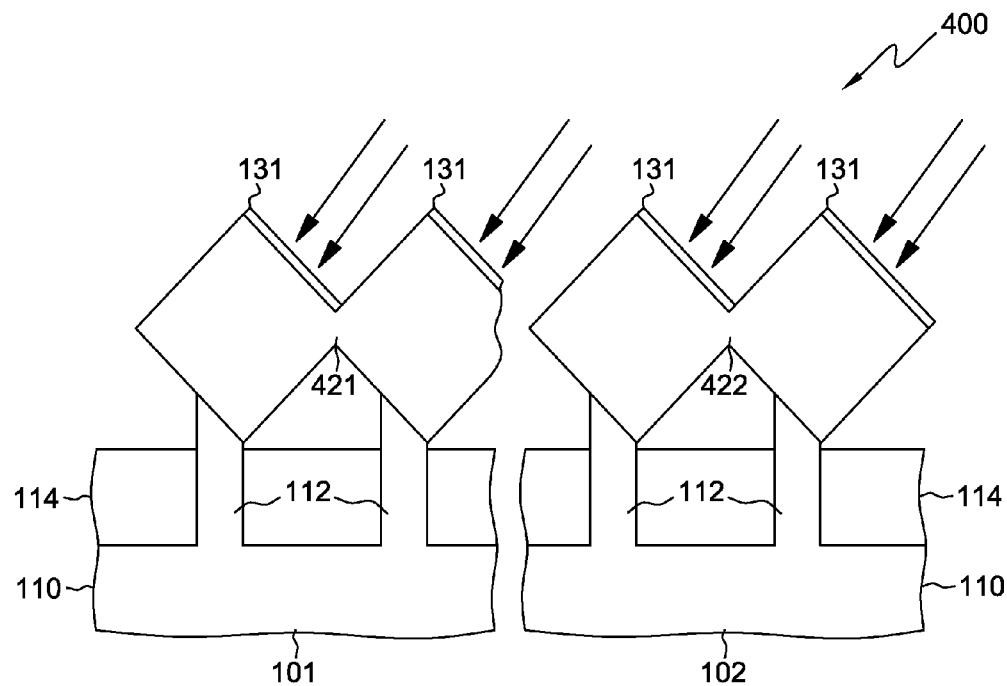
FIG. 4B is a cross-sectional elevational view of the structure of FIG. 4A after providing a first contact liner material of a contact liner over a surface (facing a first direction) of the at least one p-type source region or p-type drain region and another surface (also facing the first direction) of the at least one n-type source region or n-type drain region, in accordance with one or more aspects of the present invention.

FIG. 4B is a cross-sectional elevational view of the structure of FIG. 4A after providing a first contact liner material 131 of a contact liner over a surface (facing a first direction) of at least one p-type source region or p-type drain region 421 and another surface (also facing the first direction) of at least one n-type source region or n-type drain region 422, in accordance with one or more aspects of the present invention.

In one embodiment, a directional deposition technique may be used to deposit the first contact liner material onto only the surfaces facing the first direction, and not on surfaces facing a second direction. For instance, a gas cluster ion beam (GCIB) process may be employed. In another embodiment, the first contact liner material can be deposited along all upper surfaces of the source and drain regions, and directional etching can be used to remove first contact liner material from, for example, only surfaces facing the second direction.

Figure 4C:
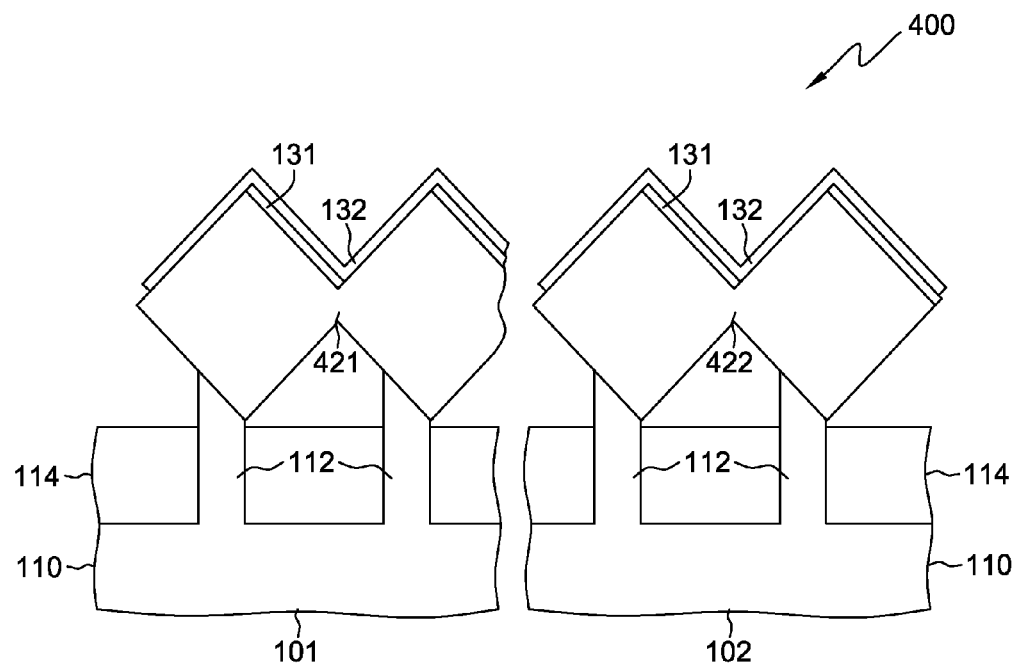
FIG. 4C is a cross-sectional elevational view of the structure of FIG. 4B after providing a second contact liner material of the contact liner over a surface (facing a second direction) of the at least one p-type source region or p-type drain region and another surface (also facing the second direction) of the at least one n-type source region or n-type drain region, in accordance with one or more aspects of the present invention.

FIG. 4C is a cross-sectional elevational view of the structure of FIG. 4B after providing a second contact liner material 132 of the contact liner over a surface (facing a second direction) of at least one p-type source region or p-type drain region 421 and another surface (also facing the second direction) of at least one n-type source region or n-type drain region 422, in accordance with one or more aspects of the present invention. In an embodiment, second contact liner material 132 can be deposited using a variety of deposition techniques, and does not require angular deposition.

Figure 4D:
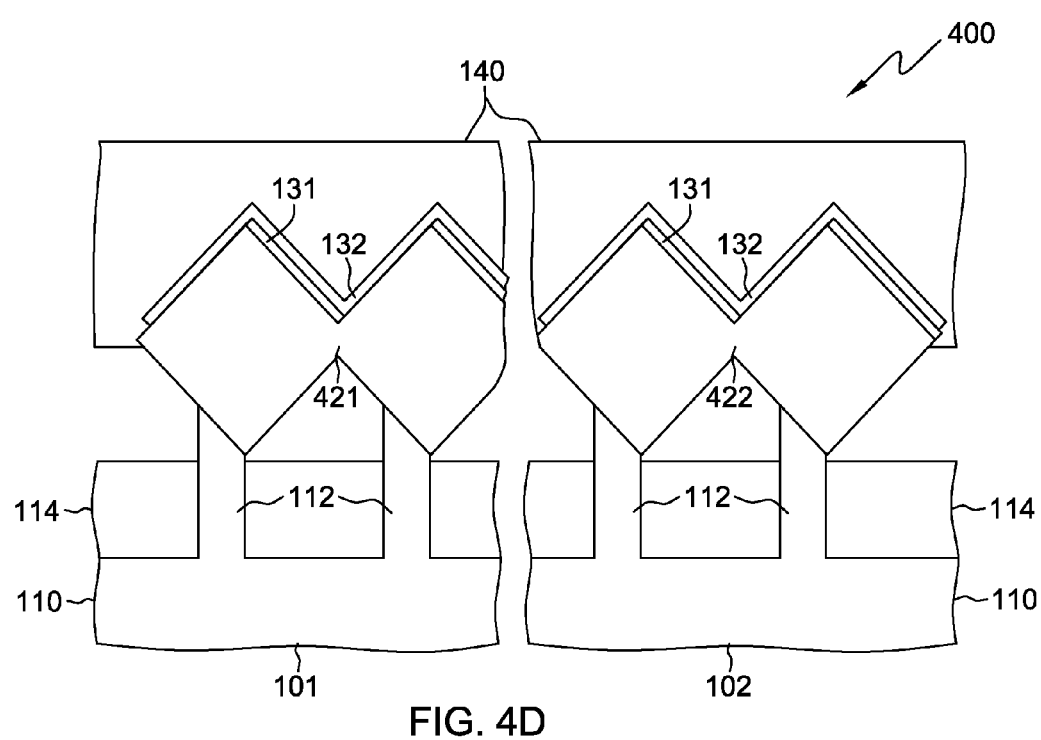
FIG. 4D is a cross-sectional elevational view of the structure of FIG. 4C after forming a conductive contact over the contact liner, in accordance with one or more aspects of the present invention.

FIG. 4D is a cross-sectional elevational view of the structure of FIG. 4C after forming a conductive contact 140 over the contact liner, in accordance with one or more aspects of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   fabricating an integrated circuit structure comprising a first transistor and a second transistor, the first transistor having at least one of a p-type source region or a p-type drain region and the second transistor having at least one of an n-type source region or an n-type drain region, the fabricating comprising:
      forming a contact liner at least partially over both the first transistor and the second transistor, comprising:
         forming a first contact liner material layer with at least a first portion directly contacting a first surface of at least one of the respective source region or the respective drain region of both the first transistor and the second transistor; and
         forming a second contact liner material layer with at least a second portion directly contacting a second surface of at least one of the respective source region or the respective drain region of both the first transistor and the second transistor, wherein the first contact liner material layer is selected to facilitate electrical connection to the at least one p-type source region or p-type drain region of the first transistor, and the second contact liner material layer is selected to facilitate electrical connection to the at least one n-type source region or n-type drain region of the second transistor, and wherein the first contact liner material layer and the second contact liner material layer are differing layers of differing materials.

2. The method of claim 1, wherein a contact resistance of the first contact liner material layer and the at least one p-type source region or p-type drain region is less than another contact resistance of the first contact liner material layer and the at least one n-type source region or n-type drain region.

3. The method of claim 1, wherein a contact resistance of the second contact liner material layer and the at least one n-type source region or n-type drain region is less than another contact resistance of the second contact liner material layer and the at least one p-type source region or p-type drain region.

4. The method of claim 1, further comprising:
forming a conductive contact over the contact liner such that the conductive contact directly contacts the first and second contact liner material layers, wherein the first contact liner material layer facilitates electrical connection of the conductive contact and the at least one p-type source region or p-type drain region and the second contact liner material layer facilitates electrical connection of the conductive contact and the at least one n-type source region or n-type drain region.

5. The method of claim 1, wherein forming the contact liner comprises:
providing an alternating pattern of the first contact liner material layer and the second contact liner material layer over both the at least one p-type source region or p-type drain region and the at least one n-type source region or n-type drain region.

6. The method of claim 1, wherein the forming the contact liner comprises:
using a single mask step in forming the first contact liner material layer and the second contact liner material layer of the contact liner.

7. The method of claim 1, wherein the forming the contact liner comprises:
forming the first contact liner material layer over a first surface of the at least one p-type source region or p-type drain region and a second surface of the at least one n-type source region or n-type drain region; and
forming the second contact liner material layer over a third surface of the at least one p-type source region or p-type drain region and a fourth surface of the at least one n-type source region or n-type drain region.

8. The method of claim 1, wherein the forming the contact liner comprises:
forming the first contact liner material layer at least partially over the at least one p-type source region or p-type drain region and at least partially over the at least one n-type source region or n-type drain region;
removing a portion of the first contact liner material layer to reveal a surface of the at least one p-type source region or p-type drain region and a surface of the at least one n-type source region or n-type drain region; and forming the second contact liner material layer at least partially over the revealed surface of the at least one p-type source region or p-type drain region and at least partially over the revealed surface of the at least one n-type source region or n-type drain region.

9. The method of claim 1, wherein the second contact liner material layer comprises titanium and the first contact liner material layer comprises a silicide.

10. The method of claim 1, wherein the forming the contact liner comprises annealing at least one of the first contact liner material layer or the second contact liner material layer.

11. The method of claim 1, wherein the at least one p-type source region or p-type drain region comprises a first diamond shaped structure and the at least one n-type source region or n-type drain region comprises a second diamond shaped structure, and the forming the contact liner comprises:
forming the first contact liner material layer at least partially over a first surface of the first diamond shaped structure and at least partially over a second surface of the second diamond shaped structure, and forming the second contact liner material layer at least partially over a third surface of the first diamond shaped structure and at least partially over a fourth surface of the second diamond shaped structure.

12. The method of claim 1, wherein the forming the contact liner comprises:
forming the first contact liner material layer at least partially over an upper portion of the at least one p-type source region or p-type drain region and at least partially over an upper portion of the at least one n-type source region or n-type drain region, and forming the second contact liner material layer at least partially over a lower portion of the at least one p-type source region or p-type drain region and a lower portion of the at least one n-type source region or n-type drain region.

13. The method of claim 1, wherein the forming the contact liner comprises:
forming the first contact liner material layer at least partially over a first surface of the at least one p-type source region or p-type drain region and at least partially over a second surface of the at least one n-type source region or n-type drain region, and forming the second contact liner material layer at least partially over a third surface of the at least one p-type source region or p-type drain region and a fourth surface of the at least one n-type source region or n-type drain region, wherein the first surface and the second surface face one direction, and the third surface and the fourth surface face another direction, the one direction and the another direction being different directions.

14. A structure comprising:
an integrated circuit structure, the integrated circuit structure comprising:
a first transistor and a second transistor, the first transistor having at least one of a p-type source region or a p-type drain region and the second transistor having at least one of an n-type source region or an n-type drain region; and
a contact liner, the contact liner disposed at least partially over both the first transistor and the second transistor, the contact liner comprising a first contact liner material layer with at least a first portion directly contacting a first surface of at least one of the respective source region or the respective drain region of both the first transistor and the second transistor and a second contact liner material layer that is different than the first contact liner material layer with at least a second portion directly contacting a second surface of at least one of the respective source region or the respective drain region of both the first transistor and the second transistor, wherein the first contact liner material layer is selected to facilitate electrical connection to the at least one p-type source region or p-type drain region of the first transistor, and the second contact liner material layer is selected to facilitate electrical connection to the at least one n-type source region or n-type drain region of the second transistor.

15. The structure of claim 14, wherein a contact resistance of the first contact liner material layer and the at least one p-type source region or p-type drain region is less than another contact resistance of the first contact liner material layer and the at least one n-type source region or n-type drain region, and wherein a contact resistance of the second contact liner material layer and the at least one p-type source region or p-type drain region is greater than another contact resistance of the second contact liner material layer and the at least one n-type source region or n-type drain region.

16. The structure of claim 14, wherein the contact resistance of the first contact liner material layer and the at least one p-type source region or p-type drain region is determined by the portion of the first contact liner material layer that is in direct contact with the at least one p-type source region or p-type drain region, wherein the contact resistance of the first contact liner material layer and the at least one n-type source region or n-type drain region is determined by the portion of the first contact liner material layer that is in direct contact with the at least one n-type source region or n-type drain region, wherein the contact resistance of the second contact liner material layer and the at least one p-type source region or p-type drain region is determined by the portion of the second contact liner material layer that is in direct contact with the at least one p-type source region or p-type drain region, and wherein the contact resistance of the second contact liner material layer and the at least one n-type source region or n-type drain region is determined by the portion of the second contact liner material layer that is in direct contact with the at least one n-type source region or n-type drain region.

17. The structure of claim 14, further comprising:
a conductive contact in contact with the first and second contact liner material layers, wherein the first contact liner material layer facilitates electrical connection of the conductive contact and the at least one p-type source region or p-type drain region and the second contact liner material layer facilitates electrical connection of the conductive contact and the at least one n-type source region or n-type drain region.

18. The structure of claim 14, the contact liner comprises:
an alternating pattern of the first contact liner material layer and the second contact liner material layer disposed over both the at least one p-type source region or p-type drain region and the at least one n-type source region or n-type drain region.

19. The structure of claim 14, wherein the first contact liner material layer is disposed over a first surface of the at least one p-type source region or p-type drain region and a second surface of the at least one n-type source region or n-type drain region, and the second contact liner material layer is disposed over a third surface of the at least one p-type source region or p-type drain region and a fourth surface of the at least one n-type source region or n-type drain region.

20. The structure of claim 14, wherein the at least one p-type source region or p-type drain region comprises a first diamond shaped structure and the at least one n-type source region or n-type drain region comprises a second diamond shaped structure, wherein the first contact liner material layer is disposed at least partially over a first surface of the first diamond shaped structure and at least partially over a second surface of the second diamond shaped structure, and the second contact liner material layer is disposed at least partially over a third surface of the first diamond shaped structure and at least partially over a fourth surface of the second diamond shaped structure.

* * * * *